United States Patent
Jankowski

(10) Patent No.: US 10,498,138 B2
(45) Date of Patent: Dec. 3, 2019

(54) PROTECTIVE CIRCUIT FOR A CURRENT TRANSFORMER AND CURRENT TRANSFORMER WITH A PROTECTION CIRCUIT

(71) Applicant: Phoenix Contact GmbH & Co. KG, Blomberg (DE)

(72) Inventor: Martin Jankowski, Seelze (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 88 days.

(21) Appl. No.: 14/442,886

(22) PCT Filed: Nov. 7, 2013

(86) PCT No.: PCT/EP2013/073305
§ 371 (c)(1),
(2) Date: May 14, 2015

(87) PCT Pub. No.: WO2014/075989
PCT Pub. Date: May 22, 2014

(65) Prior Publication Data
US 2015/0333509 A1 Nov. 19, 2015

(30) Foreign Application Priority Data
Nov. 16, 2012 (DE) .......................... 10 2012 111 061

(51) Int. Cl.
*H02H 9/04* (2006.01)
*H02H 7/04* (2006.01)

(52) U.S. Cl.
CPC ............ *H02H 9/041* (2013.01); *H02H 7/042* (2013.01); *H02H 9/043* (2013.01)

(58) Field of Classification Search
CPC ........ H02H 9/041; H02H 9/043; H02H 7/042; G01R 1/30
See application file for complete search history.

(56) References Cited

U.S. PATENT DOCUMENTS

| | | | |
|---|---|---|---|
| 3,030,524 A | 4/1962 | Miller | |
| 4,521,822 A * | 6/1985 | Simard | H02H 7/042 315/125 |

(Continued)

FOREIGN PATENT DOCUMENTS

| | | |
|---|---|---|
| CN | 102709901 A | 10/2012 |
| DE | 19641187 | 4/1998 |

(Continued)

OTHER PUBLICATIONS

The International Preliminary Report on Patentability, PCT Int. Serial No. PCT/EP2013/073305, Int. Filing Date Nov. 7, 2013, Applicant: Phoenix Contact GmbH & Co. KG, dated May 19, 2015.
Breimer et al, "Frachkunde Elektrotechnik", Verlag Willing & Co., 7. Auflage, 1965, s. 164-167.
Wikipedia Article, "Solid-state-relay", Version from Oct. 25, 2015.
Wikipedia Article, "Stromwandler", Version from Sep. 2, 2012.

(Continued)

*Primary Examiner* — Thienvu V Tran
*Assistant Examiner* — Christopher J Clark
(74) *Attorney, Agent, or Firm* — Reising Ethington PC

(57) ABSTRACT

A protective circuit for a current transformer for preventing a secondary voltage on a secondary circuit of the current transformer from exceeding a secondary voltage threshold. A protective circuit input can be coupled to the secondary circuit of the current transformer such that the secondary voltage is applied to the protective circuit input. A control unit is connected to the protective circuit input. A switch unit is connected to the protective circuit input and is operatively connected to the control unit. The control unit is adapted to provide a control signal to the switch unit in response to the secondary voltage exceeding the secondary voltage threshold. The switch unit is adapted to short-circuit the protective circuit input in response to the control signal provided by the control unit. The switch unit is implemented as a semiconductor circuit.

19 Claims, 2 Drawing Sheets

(56) References Cited

U.S. PATENT DOCUMENTS

| | | | | |
|---|---|---|---|---|
| 4,698,740 A | * | 10/1987 | Rodgers | H02M 3/1563 323/223 |
| 5,103,154 A | | 4/1992 | Dropps et al. | |
| 5,488,534 A | | 1/1996 | Rau et al. | |
| 5,751,530 A | * | 5/1998 | Pelly | H02H 3/00 361/35 |
| 2004/0075965 A1 | * | 4/2004 | Lewis | H02M 5/293 361/160 |
| 2004/0257742 A1 | | 12/2004 | Zeller et al. | |
| 2012/0200967 A1 | * | 8/2012 | Mikolajczak | H02H 3/20 361/79 |
| 2012/0243136 A1 | | 9/2012 | Mossoba et al. | |
| 2012/0250205 A1 | * | 10/2012 | Pfitzer | H02H 9/041 361/91.1 |
| 2013/0235527 A1 | * | 9/2013 | Wagner | H05K 1/0203 361/702 |
| 2015/0244176 A1 | * | 8/2015 | Van Den Brink | H02J 5/005 307/104 |

FOREIGN PATENT DOCUMENTS

| | | |
|---|---|---|
| DE | 102007008264 A1 | 8/2008 |
| EP | 1304786 | 4/2003 |
| WO | 2004040761 A1 | 5/2004 |

OTHER PUBLICATIONS

Wikipedia Article, "Varistor", Version from May 24, 2012.
German office Action, Serial No. 10 2012 111 061.1, Applicant: Phoenix Contact GmbH & Co. KG, dated Jul. 15, 2013.
International Search Report and Written Opinion, Int. Serial No. PCT/EP2013/073305, Int. Filing Date: Nov. 7, 2013, Applicant: Phoenix Contact GmbH & Co. KG, dated Apr. 25, 2014.
Chinese Office Action, Application No. 20138006572.X, Applicant: Phoenix Contact GmbH & Co. Ltd., Title: Protective Circuit for a Current Transformer and Current Transformer with a Protection Circuit, dated Mar. 2, 2017.
European Office Action, Serial No. 13 789 278.2-1202, Applicant: Phoenix Contact GmbH & Co. KG, Date: Aug. 1, 2018.

* cited by examiner

PROTECTIVE CIRCUIT FOR A CURRENT TRANSFORMER AND CURRENT TRANSFORMER WITH A PROTECTION CIRCUIT

TECHNICAL FIELD

The present disclosure relates to a protective circuit for a current transformer for preventing a secondary voltage on a secondary circuit of the current transformer from exceeding a secondary voltage threshold. The present disclosure further relates to a current transformer comprising a protective circuit.

BACKGROUND

Current transformers generally operate at a secondary side short-circuit, for example by employing an ammeter in the secondary circuit, since otherwise a voltage across the secondary terminals can adopt unacceptable high levels. In order to achieve protection of the transformer in the event of an interruption of its secondary side short-circuit, for example when the meter including its shunt resistor is removed, circuit breakers have been known for re-establishing the short-circuit upon occurrence of unacceptably high secondary voltages.

Voltage peaks that occur in case of an open secondary circuit of the current transformer can be very high and therefore life-threatening and can moreover result in damage of the current transformer.

As a remedy, short-circuiting devices have been known which short-circuit instantaneously, for example using diodes or relays, or with a delay. For delayed short-circuiting, implementations are known which periodically short-circuit, for example using a thermistor, or which permanently short-circuit, for example when a spacer has softened.

Devices that are short-circuiting when a secondary cover is lifted or a connector is unplugged are problematic in that they do not have any effect in case of an interruption elsewhere in the secondary circuit.

Relays can be designed so as to automatically re-enable the current transformer secondary circuit once the interruption has been rectified, and that without major delays.

However, usually such a device cannot be accommodated in a secondary terminal box of a current transformer. In addition, it is expensive and does not always meet the high operational requirements in terms of operational safety and weather resistance.

For example, from FR 1 178 783 a circuit breaker is known wherein in the event of unacceptably high secondary voltages a voltage-dependent circuit element actuates a switch powered by the current transformer. The secondary winding and the burden of the converter have connected in parallel thereto a series connection of two antiparallel-connected rectifiers and a relay implemented as a thermal overload relay. If the secondary voltage reaches a critical value the relay is responsive to close a contact which establishes a short circuit path bridging either only the rectifiers, or the series connection of rectifiers and relay.

A drawback of this known circuit breaker is its high inertness so that both the response and the restoration of the normal operating condition after the decay of the excessively high secondary voltage are effected with a time delay. Furthermore, due to its size it is difficult for such a circuit breaker to be accommodated in the secondary terminal box of the current transformer, moreover it is expensive and problematic in terms of operational safety.

GENERAL DESCRIPTION

An object of the present disclosure may include enhancing a protective circuit for a current transformer in terms of quicker response, higher load current, better operational safety, lower overall volume, and/or lower production costs.

This object is achieved by the subject matter of the independent claims. Advantageous embodiments and modifications are specified in the dependent claims. The features of the embodiments may be combined with each other and with the features of the independent claims, as far as technologically appropriate.

One aspect of the present disclosure relates to a protective circuit for a current transformer. The current transformer is essentially a short-circuited transformer that is used for potential-free measurement of alternating currents. It is preferably used for feeding ammeters or energy meters.

The primary winding of the current transformer often comprises a single turn, for example a copper rail, while the secondary winding has a higher number of turns. This means that in an open-circuit state the voltage of the primary circuit will be transformed to an even higher voltage in the secondary circuit. The high voltage in the secondary circuit may cause danger to persons or a damage of the current transformer.

The protective circuit serves to prevent a secondary voltage on a secondary circuit of a current transformer from exceeding a secondary voltage threshold. The secondary voltage threshold may, for example, have a value preset during manufacturing of the protective circuit, or a value adjustable by an operator.

The protective circuit may have a protective circuit input, preferably in form of contact pins or a pair of terminals, which can be coupled to the secondary circuit of the current transformer so that the secondary voltage is applied to the protective circuit input.

The protective circuit may further comprise a control unit connected to the protective circuit input, and a switch unit connected to the protective circuit input and operatively connected to the control unit.

The control unit may be adapted to provide a control signal to the switch unit in response to the secondary voltage exceeding the secondary voltage threshold. The secondary voltage value which is compared with the secondary voltage threshold may be an amplitude, a mean value, an instantaneous value, or an effective value of the secondary voltage.

The control unit may be implemented in form of an electronic circuit, for example on a semiconductor basis, in particular in form of an integrated circuit.

The switch unit may be adapted to short-circuit the protective circuit input in response to the control signal supplied from the control unit. The control signal may be provided on the line connecting the control unit with the switch unit, namely in form of a voltage which changes its value when the secondary voltage threshold is exceeded, or in response thereto, for example from LOW to HIGH, or vice versa.

Short-circuiting of the protective circuit input may be considered as the switch element adopting a low electrical resistance value of less than 10Ω, or 1Ω, or 0.1Ω, which is thus connected to the protective circuit input.

The switch unit may be implemented as a semiconductor circuit. The semiconductor circuit may preferably be implemented in form of a semiconductor switch or semiconductor relay. Here, a semiconductor switch refers to a switch implemented on semiconductor basis. A semiconductor relay refers to a relay implemented on semiconductor basis.

When compared to electromechanical relays (EMR), switches or relays implemented on semiconductor basis provide a variety of advantages:

Semiconductor switches are typically smaller than EMRs, thereby allowing to save valuable space on printed circuit boards.

Semiconductor switches offer better system reliability because they do not have any moving parts or contacts that could wear out.

Semiconductor switches switch without bouncing.

Semiconductor switches offer better system life costs, including a simpler circuit with lower power requirements and lower heat dissipation requirements.

Semiconductor switches can use surface mount technology (SMT), resulting in lower assembly costs and simple circuit board assembly.

Semiconductor switches cannot be affected by magnetic fields.

Semiconductor switches are not susceptible to mechanical influences such as shock and vibration.

Semiconductor switches do not generate any electromagnetic interference and are not susceptible to such influences (EMC, EMI).

Semiconductor switches can advantageously be processed like ICs on printed circuit boards.

Another aspect of the present disclosure relates to a current transformer, preferably a straight-through transformer, comprising an integrated protective circuit as described above.

According to the present disclosure, the size of the protective circuit may be smaller compared to conventional protective circuits;

a current transformer with integrated protective circuit can be provided, which in terms of its dimensions may not differ or only slightly differs from a conventional current transformer; and a low response time of the protective circuit may be ensured.

Further aspects of the present disclosure are associated with the implementation of the control unit and the switch unit on semiconductor basis.

The features of the following modifications and embodiments of the present disclosure may be combined with the aspects of the present disclosure mentioned above.

According to one embodiment, the controller can be connected directly to the input of the protective circuit.

Furthermore, the switch unit can be connected directly to the input of the protective circuit.

Here, "directly connected" means that the component "control unit" and/or "switch unit" is directly coupled or connected to the input of the protective circuit, without any electrical or mechanical elements between the component and the protective circuit input.

The protective circuit may comprise a limiting unit connected to the input of the protective circuit, for overvoltage protection. The limiting unit may comprise a voltage-dependent resistor. The voltage-dependent resistor has a constant value as long as the voltage applied to the limiting unit is below a threshold value. When the voltage exceeds the threshold value, the resistor reduces its value, so that the current through the resistor increases and the voltage applied across the resistor does not exceed the threshold value.

The limiting unit, the switch unit, and the control unit complement and support each other with respect to the protective function for the current transformer. On the one hand, this is because the switch unit is designed for greater currents than the limiting unit. Together, the switch unit and limiting unit components can tolerate a higher current than either component alone.

On the other hand, the limiting unit supports the control unit, since by virtue of the parallel connection of limiting unit and control unit a defined voltage is provided or facilitated at the input of the control unit. Hence, the likelihood of damage to the control unit by an excessive voltage at the input of the control unit can be reduced.

In addition, the usage of the limiting unit allows to use components for the control unit and the switch unit, which are not designed for high voltages, so that low-cost components can be used for this purpose.

According to one embodiment, the control unit may comprise a comparator unit which is adapted to provide the control signal to the switch unit if an input voltage of the comparator exceeds a threshold value.

The control unit may further comprise a rectifier connected to the protective circuit input for providing a DC voltage, preferably a pulsating DC voltage, depending on an amplitude of the secondary voltage, as an input voltage for the comparator unit.

The rectifier enables the control unit to respond during both negative and positive half-waves of the secondary voltage, which provides for a further shortening of the response time.

According to one embodiment, the comparator unit may comprise a comparator having a positive input, a negative input on which a voltage of approximately the level of the input voltage of the comparator unit is applied, and an output which provides the control signal.

The comparator may further comprise a voltage divider, wherein the positive input is connected to the input voltage of the comparator unit via the voltage divider. As a result, an input voltage reduced according to the division ratio of the voltage divider can be supplied to the positive input of the comparator.

The comparator unit may furthermore comprise a Zener diode which is connected to the negative input, for limiting a voltage applied to the negative input. This ensures that the voltage applied at the negative input of the comparator is not greater than the breakdown voltage of the Zener diode.

The comparator unit may comprise a capacitor which is connected to the positive input.

According to one embodiment, the switch unit may include a plurality of MOSFETs.

The switch unit may comprise two MOSFETs arranged in a back-to-back circuit. In this case, the drain terminals of the transistors may be connected to the respective terminals of the protective circuit input, and the gates may be connected to the control unit for supplying the control signal. The back-to-back circuit can be used for very high currents. In addition, the back-to-back circuit is AC compatible, since current flow is possible in both directions.

The switch unit may in particular comprise a solid-state relay (SSR).

Alternatively, the switch unit may comprise a thyristor, preferably a triode for alternating current (TRIAC). A TRIAC has a very high internal resistance up to its reverse voltage, so it does not affect the measurement accuracy of the current transformer. On the other hand, its internal resistance decreases rapidly to values of $\ll 1\ \Omega$ when triggered, so that a secondary short circuit of the transformer is produced then.

The switch unit may comprise an opto-isolator for injecting the control signal. In this manner, the switch unit can be electrically isolated from the control unit.

According to one embodiment, the limiting unit may comprise a transient voltage suppression (TVS) diode, or transient absorption Zener (TAZ) diode. The TVS diode provides protection against short overvoltage pulses for the protective circuit input and for all components connected thereto, such as the secondary circuit, control unit, and switch unit.

Alternatively or additionally, the limiting unit may comprise a varistor and/or a gas discharge tube to protect the input of the protective circuit from short overvoltage pulses.

According to one embodiment, the protective circuit may be accommodated directly on the current transformer, more specifically in the housing of the current transformer, preferably in a secondary terminal box of the current transformer. In this case, a housing of the current transformer may be configured so as to comprise the secondary terminal box in which the secondary circuit terminals of the current transformer are arranged, and a secondary circuit housing, in which the secondary coil of the current transformer is disposed.

For an arrangement comprising a current transformer and a protective circuit an accommodation of the protective circuit in this manner provides enhanced weather resistance due to its compact design.

The present disclosure will now be explained in more detail by way of illustrative embodiments and with reference to the drawings wherein the same reference numerals denote the same or equivalent elements. The features of different illustrative embodiments may be combined.

DETAILED DESCRIPTION

Figure 1:
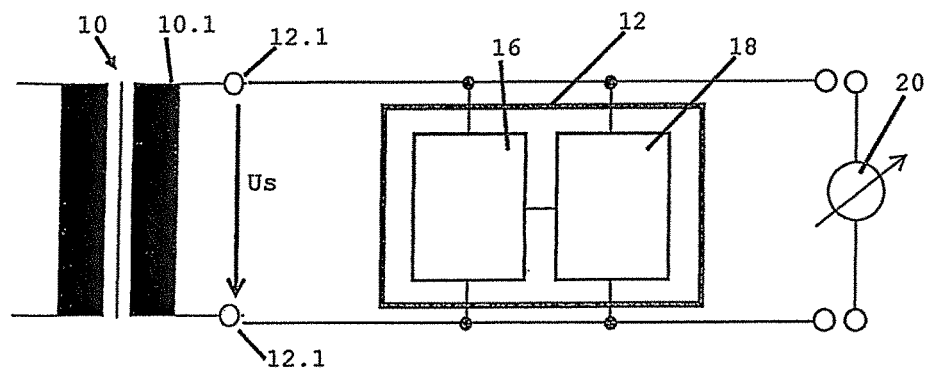
FIG. 1 is a schematic diagram of a first embodiment of the protective circuit in combination with a current transformer.

FIG. 1 shows a first illustrative embodiment of the protective circuit 12 for a current transformer 10 according to the present disclosure. Protective circuit 12 serves to prevent a secondary voltage Us in a secondary circuit 10.1 of the current transformer 10 from exceeding a secondary voltage threshold.

Protective circuit 12 comprises:
a protective circuit input 12.1 coupled to the secondary circuit 10.1 of the current transformer 10 so that the secondary voltage Us is applied to the protective circuit input 12.1;
a control unit 16 connected to the protective circuit input 12.1; and
a switch unit 18 connected to the protective circuit input 12.1 and operatively connected to the control unit 16.

Control unit 16 is adapted to provide a control signal to the switch unit 18 in response to the secondary voltage Us exceeding the secondary voltage threshold.

Switch unit 18 is adapted to short-circuit the protective circuit input 12.1 in response to the control signal provided by the control unit 16.

FIG. 1 further shows an ammeter 20 which is adapted for measuring the current flow through secondary circuit 10.1. During the measuring operation, an overvoltage in the secondary circuit 10.1 is very unlikely to occur. However, when the ammeter 20 is disconnected from secondary circuit 10.1, which is indicated in FIG. 1, the probability for an overvoltage or excessive secondary voltage Us to occur increases substantially.

The functioning of protective circuit 12 will now be explained below.

When an excessive secondary voltage Us occurs at the secondary circuit 10.1, the voltage applied to control unit 16 will exceed a preset secondary voltage threshold. In response to the threshold being exceeded, control unit 16 provides a control signal to switch unit 18, which changes from LOW to HIGH, for example. In response to the control signal, switch unit 18 reduces its internal resistance to nearly zero thus short-circuiting the secondary circuit 10.1.

Figure 2:
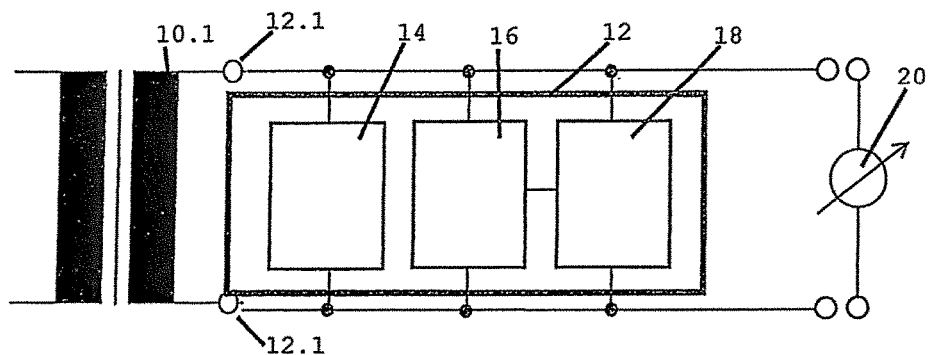
FIG. 2 is a schematic diagram of a second embodiment of the protective circuit in combination with a current transformer.

FIG. 2 shows a second illustrative embodiment of the protective circuit 12 for a current transformer 10 according to the present disclosure. In contrast to the first illustrative embodiment, the protective circuit 12 according to the illustrative embodiment shown in FIG. 2 comprises a limiting unit 14 which is connected in parallel to control unit 16 and to switch unit 18, and which is connected to the secondary circuit 10.1.

Limiting unit 14, switch unit 18 and control unit 16 complement and support each other with respect to the protective function for current transformer 12. On the one hand, this is because switch unit 18 is designed for greater currents than limiting unit 14. Together, the components switch unit 18 and limiting unit 14 can tolerate a higher current than either component alone.

On the other hand, limiting unit 14 supports control unit 18, since by virtue of the parallel connection of limiting unit 14 and control unit 18 a defined voltage is provided or facilitated at the input of the control unit 18.

As is generally known, transient voltage suppression (TVS) diodes which are preferably employed for limiting unit 14 still have a finite internal resistance after reaching the breakdown voltage (see FIG. 4), so that they can only carry continuous currents that are lower than the usual secondary nominal currents of transformers. This is a possible reason why so far no protective circuits have been known that consist solely of TVS diodes.

The short time required for shorting switch unit 18 ensures a negligible inertness of protective circuit 12, since control unit 16 is capable of "sampling" each half wave of the voltage at secondary circuit 10.1. Therefore, as soon as the voltage has dropped below a predetermined threshold, the secondary-side short circuit caused by protective circuit 12 is automatically eliminated in the shortest time. Triggering occurs periodically.

Figure 3:
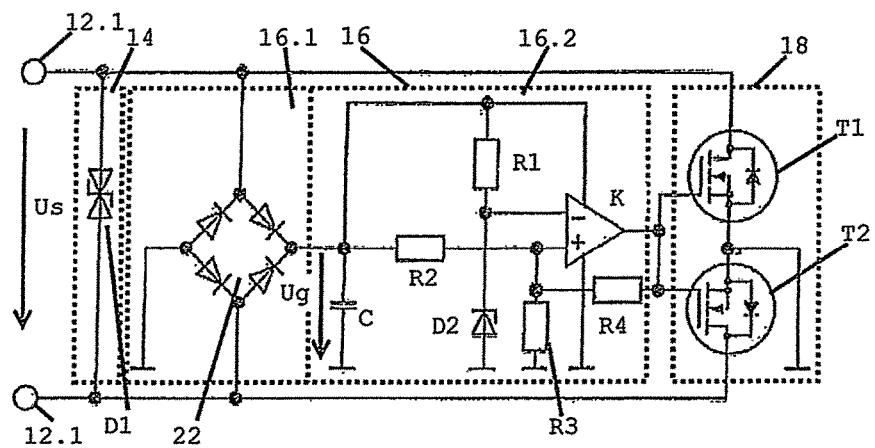
FIG. 3 is a detailed schematic diagram of the second embodiment of the protective circuit.

FIG. 3 shows details of the embodiment of the protective circuit 12 shown in FIG. 2. Accordingly, control unit 16 comprises a rectifier 16.1 and a comparator unit 16.2. Comparator unit 16.2 comprises:
a comparator K having a positive input, a negative input at which a voltage of approximately the level of the input voltage of comparator unit 16.2 is applied, and an output which provides the control signal;

a voltage divider R2, R3, wherein the positive input is connected to the input voltage of the comparator unit 16.2 via the voltage divider R2, R3;

a Zener diode D2 which is connected to the negative input, for limiting a voltage applied to the negative input;

a capacitor C which is connected to the positive input.

Figure 4:
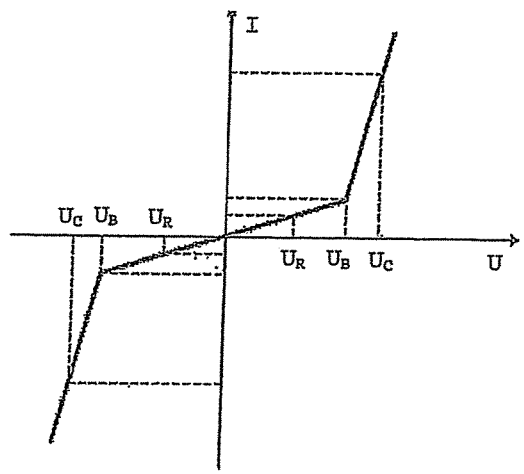
FIG. 4 shows a current-voltage characteristic of a transient voltage suppression diode.

Limiting unit 14 comprises a transient voltage suppression (TVS) diode D1. A current-voltage characteristic of the TVS diode D1 is schematically shown in FIG. 4. It can be seen therefrom that the TVS diode D1 operates bidirectionally in the reverse mode. The forward characteristic is irrelevant.

Significant points of the curve are:
UR reverse standoff voltage
UB breakdown voltage;
UC clamping voltage.

Switch unit 18 comprises two MOSFETs T1, T2 arranged in a back-to-back circuit. Here, the drain terminals of transistors T1, T2 are connected to the respective terminals of the protective circuit input, and the gates are connected to the comparator K of comparator unit 16.2 for supplying the control signal.

In this case, a short circuit is automatically established with the small and lightweight semiconductors of the two N-channel FETs arranged in the back-to-back circuit.

The two transistors T1, T2 short-circuit the alternative current through the secondary circuit 10.1 virtually without power consumption. This permits to divert very high currents, such as a thermal rated short-time withstand current, which is 60 times the nominal current of 5 A, i.e. 300 A, for one second, and to divert a rated overvoltage current which is 2.5 times the rated short-time withstand current, i.e. 750 A, for one half-wave.

Short-circuiting is effected before the voltage exceeds a dangerous level. Such a value corresponds to a ratio of rated power to rated secondary current of the transducer.

According to FIG. 3, the rectified voltage Ug is compared with the voltage at a Zener diode D2, by comparator K. The current through rectifier 22 charges the capacitor C which provides the necessary voltage for comparator K and for driving transistors T1, T2.

As soon as the voltage at the input of comparator K reaches the threshold voltage of comparator K, the secondary circuit 10.1 is short-circuited and capacitor C discharges through R1, R2, R3, D1, and K, until the turn-off voltage at the positive input of comparator K is reached again.

For example, if R4 is very large and at the same time R2, R3 are equal, then a resulting secondary voltage threshold will be twice the Zener voltage. Thus, the parameters of the components of control unit 16, preferably the parameters of R1, R2, R3, D1, and K, allow to define the secondary voltage threshold, in particular in relation to the secondary voltage Us.

The operating voltage of comparator K is isolated from the short circuit by the rectifier diodes. If after elimination of the short circuit an excessive voltage continues to exist at secondary circuit 10.1, the process is repeated, so that the turn-on voltage at the positive input of comparator K can never be exceeded.

The turn-on and turn-off voltages at the positive input of comparator K are separated via R4 due to a hysteresis of the comparator unit 16.2, so that no undefined oscillations can arise. The switching thresholds are determined by the Zener diode D2 and the hysteresis set. The ratio of resistors R2, R3 to capacitor C determines the frequency at which a switching event occurs.

This protective circuit 12 can be accommodated in the head of current transformer 10 and can be hard-wired to the secondary circuit 10.1. Thus, the automatic short-circuiting will always work, regardless of where the secondary circuit 10.1 is interrupted.

When the protective circuit 12 is accommodated in a switch cabinet, for example, which houses the components of a system in which the current transformer 10 is arranged for a current measurement, a connecting cable to the protective circuit 12 can be interrupted at any point between the current transformer 10 and the measuring device 20, directly or immediately at the terminals of the current transformer 10 or of the measuring device 20.

It is also possible for the protective circuit 12 to be integrated into the secondary circuit once the current transformer 10 has been manufactured. That is to say, current transformer 10 can be retrofitted with protective circuit 12.

One way to reduce costs and installation size is to limit the maximum current of the secondary circuit 10.1 by varying the material of the current transformer 10. The magnetic flux can be limited by adapting the core material, which also limits the current in the secondary circuit 10.1.

Figure 5:
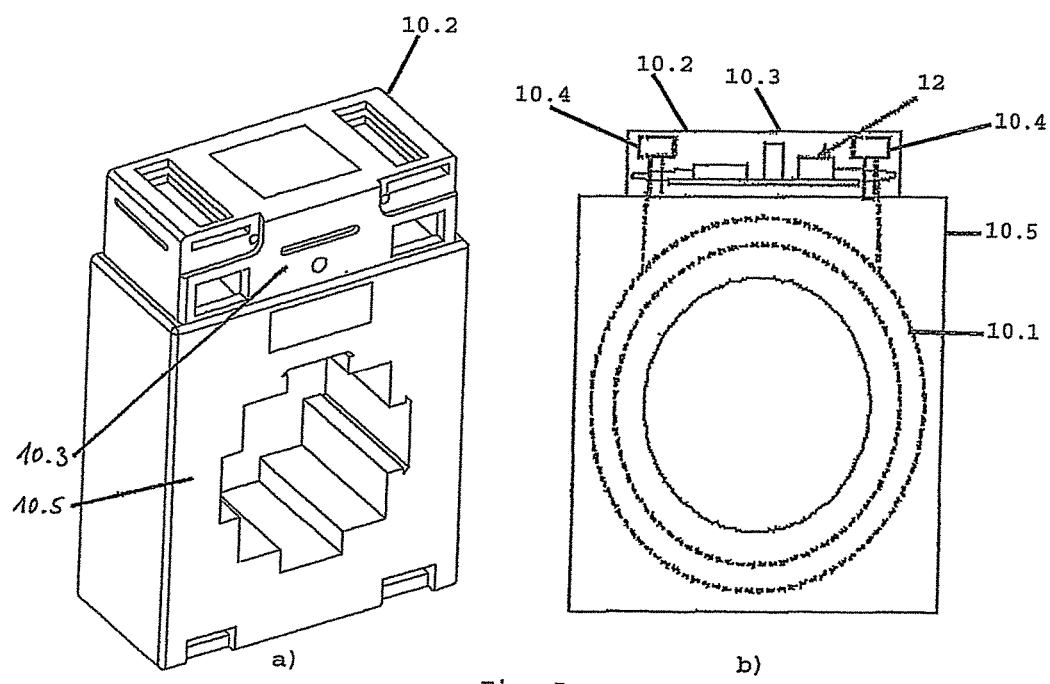
FIG. 5a is a perspective view of a current transformer.
FIG. 5b is a sectional view of the current transformer.

FIGS. 5a, 5b show two views of a current transformer housing 10.2 which accommodates a current transformer 10. Current transformer housing 10.2 comprises:

a secondary circuit housing 10.5 which accommodates the secondary circuit 10.1 of current transformer 10; and a secondary terminal housing 10.3, also known as "secondary terminal box", which accommodates the secondary terminals at which the secondary voltage Us can be tapped.

Protective circuit 12 is preferably accommodated or arranged in secondary terminal box 10.3 of current transformer housing 10.2. Protective circuit 12 is disposed directly or immediately next to the secondary terminals of secondary circuit 10.1. Thus, the protective circuit is completely integrated in the housing 10.2 of current transformer 10.

The invention claimed is:

1. A protective circuit for a current transformer for preventing a secondary voltage on a secondary circuit of the current transformer from exceeding a secondary voltage threshold, comprising:

a protective circuit input which can be coupled to the secondary circuit of the current transformer such that the secondary voltage is applied to the protective circuit input;

a control unit connected to the protective circuit input; and a switch unit connected to the protective circuit input and operatively connected to the control unit;

wherein the control unit is adapted to provide a control signal to the switch unit in response to the secondary voltage exceeding the secondary voltage threshold; and the switch unit is implemented as a semiconductor circuit comprising two MOSFETs that i) have gates connected to each other and also to the control unit for receiving the control signal from the control unit, and ii) are arranged in a back-to-back circuit adapted to adopt a resistance of less than ten ohms for short-circuiting the protective circuit input in response to the control signal supplied from the control unit.

2. The protective circuit as claimed in claim 1, characterized by at least one of the following features:

the control unit is connected directly or immediately to the protective circuit input;

the switch unit is connected directly or immediately to the protective circuit input; or the protective circuit comprises a limiting unit connected to the protective circuit input, for overvoltage protection.

3. The protective circuit as claimed in claim 1, wherein the control unit comprises one or more of the following components:
 a comparator unit which is adapted to provide the control signal to the switch unit if an input voltage of the comparator unit exceeds a threshold; or
 a rectifier connected to the protective circuit input for providing a preferably pulsating direct current voltage depending on an amplitude of the secondary voltage, as an input voltage for the comparator unit.

4. The protective circuit as claimed in claim 3, wherein the comparator unit comprises one or more of the following components:
 a comparator having a positive input, a negative input on which a voltage of approximately the level of the input voltage of the comparator unit is applied, and an output which provides the control signal;
 a voltage divider, wherein the positive input is connected to the input voltage of the comparator unit via the voltage divider;
 a Zener diode which is connected to the negative input, for limiting a voltage applied to the negative input; or
 a capacitor which is connected to the positive input.

5. The protective circuit as claimed in claim 1, wherein the switch unit comprises the following component:
 an opto-isolator for introducing the control signal.

6. The protective circuit as claimed in claim 2, wherein the limiting unit comprises one or more of the following components:
 a transient voltage suppression diode;
 a varistor; or
 a gas discharge tube.

7. A current transformer comprising a protective circuit as claimed in claim 1.

8. The current transformer as claimed in claim 7, wherein the protective circuit is hosted in a housing of the current transformer, in particular in a secondary terminal box of the current transformer.

9. A current transformer comprising:
 a housing or a secondary terminal box; and
 a protective circuit hosted in the housing or in the secondary terminal box for preventing a secondary voltage on a secondary circuit of the current transformer from exceeding a secondary voltage threshold,
 the protective circuit being disposed directly or immediately next to the secondary terminals of the secondary circuit, thus being completely integrated in the housing of the current transformer, the protective circuit comprising:
  a protective circuit input which can be coupled to the secondary circuit of the current transformer such that the secondary voltage is applied to the protective circuit input;
  a control unit connected to the protective circuit input; and
  a switch unit connected to the protective circuit input and operatively connected to the control unit;
  wherein
  the control unit is adapted to provide a control signal to the switch unit in response to the secondary voltage exceeding the secondary voltage threshold; and
  the switch unit is implemented as a semiconductor circuit comprising two MOSFETs that i) have gates connected to each other and also to the control unit for receiving the control signal from the control unit and ii) are arranged in a back-to-back circuit adapted to adopt a resistance of less than ten ohms for short-circuiting the protective circuit input in response to the control signal supplied from the control unit.

10. The current transformer as claimed in claim 9, wherein the protective circuit further comprises at least one of the following features:
 the control unit is connected directly or immediately to the protective circuit input;
 the switch unit is connected directly or immediately to the protective circuit input;
 the protective circuit comprises a limiting unit connected to the protective circuit input, for overvoltage protection;
 the control unit comprises a comparator unit which is adapted to provide the control signal to the switch unit if an input voltage of the comparator unit exceeds a threshold; or
 the control unit comprises a rectifier connected to the protective circuit input for providing a preferably pulsating direct current voltage depending on an amplitude of the secondary voltage, as an input voltage for the comparator unit.

11. The current transformer as claimed in claim 10, wherein the comparator unit comprises at least one of the following features:
 a comparator having a positive input, a negative input on which a voltage of approximately the level of the input voltage of the comparator unit is applied, and an output which provides the control signal;
 a voltage divider, wherein the positive input is connected to the input voltage of the comparator unit via the voltage divider;
 a Zener diode which is connected to the negative input, for limiting a voltage applied to the negative input; or
 a capacitor which is connected to the positive input.

12. The current transformer as claimed in claim 9, wherein the switch unit comprises the following feature:
 an opto-isolator for introducing the control signal.

13. A protective circuit for a current transformer for preventing a secondary voltage on a secondary circuit of the current transformer from exceeding a secondary voltage threshold, comprising:
 a protective circuit input which can be coupled to the secondary circuit of the current transformer such that the secondary voltage is applied to the protective circuit input;
 a control unit connected to the protective circuit input; and
 a switch unit connected to the protective circuit input and operatively connected to the control unit;
 wherein
 the control unit is adapted to provide a control signal to the switch unit in response to the secondary voltage exceeding the secondary voltage threshold;
 the switch unit is implemented as a semiconductor circuit comprising two MOSFETs that i) have gates linked together for receiving the control signal from the control unit, and ii) are arranged in a back-to-back circuit adapted to adopt a resistance of less than ten ohms for short-circuiting the protective circuit input in response to the control signal supplied from the control unit; and the protective circuit comprises a limiting unit connected in parallel with the protective circuit input, the control unit, and the switch unit, for overvoltage protection.

14. The protective circuit as claimed in claim 13, wherein the limiting unit comprises a transient voltage suppression (TVS) diode that operates bidirectionally in a reverse mode.

15. The protective circuit as claimed in claim 13, wherein the limiting unit is connected in parallel to the control unit and to the switch unit and is connected to the secondary circuit.

16. The protective circuit as claimed in claim 13, wherein the control unit includes:
 a comparator unit which is adapted to provide the control signal to the switch unit if an input voltage of the comparator unit exceeds a threshold, and comprising:
  a comparator having a positive input, a negative input on which a voltage of approximately the level of the input voltage of the comparator unit is applied, and an output which provides the control signal, and
  a Zener diode connected to the negative input, for limiting a voltage applied to the negative input.

17. The protective circuit as claimed in claim 16, wherein the control unit also includes:
 a rectifier connected to the protective circuit input for providing an input voltage for the comparator unit.

18. The protective circuit as claimed in claim 1, wherein the two MOSFETs are arranged in parallel across the protective circuit input and the secondary circuit.

19. The current transformer as claim in claim 9, wherein the at least one MOSFET is directly connected in parallel across the protective circuit input.

* * * * *